(12) United States Patent
Brennan et al.

(10) Patent No.: US 7,465,655 B2
(45) Date of Patent: Dec. 16, 2008

(54) INTEGRATED CIRCUIT WITH SUBSTANTIALLY PERPENDICULAR WIRE BONDS

(75) Inventors: John M. Brennan, Wyomissing, PA (US); Donald Farrell, Allentown, PA (US); Joseph Michael Freund, Fogelsville, PA (US)

(73) Assignee: Agere Systems Inc., Allentown, PA (US)

( * ) Notice: Subject to any disclaimer, the term of this patent is extended or adjusted under 35 U.S.C. 154(b) by 214 days.

(21) Appl. No.: 11/494,221

(22) Filed: Jul. 27, 2006

(65) Prior Publication Data

US 2006/0264024 A1   Nov. 23, 2006

Related U.S. Application Data

(62) Division of application No. 10/926,631, filed on Aug. 26, 2004, now Pat. No. 7,109,589.

(51) Int. Cl.
*H01L 21/44* (2006.01)
*B23K 37/00* (2006.01)

(52) U.S. Cl. ............................. 438/617; 257/E21.506; 228/4.5

(58) Field of Classification Search .................. 438/329, 438/617; 257/E21.506, E21.509, E21.513; 228/4.5

See application file for complete search history.

(56) References Cited

U.S. PATENT DOCUMENTS

| | | | |
|---|---|---|---|
| 4,393,392 A * | 7/1983 | Hale | 257/664 |
| 5,205,463 A * | 4/1993 | Holdgrafer et al. | 228/102 |
| 5,488,252 A | 1/1996 | Johansson et al. | |
| 6,077,753 A * | 6/2000 | Johansson et al. | 438/318 |
| 6,414,389 B1 | 7/2002 | Hume et al. | |
| 7,074,705 B2 * | 7/2006 | Miller et al. | 438/617 |
| 2004/0061214 A1 | 4/2004 | Crescenzi, Jr. | |

\* cited by examiner

*Primary Examiner*—Scott B. Geyer
*Assistant Examiner*—Seahvosh J Nikmanesh
(74) *Attorney, Agent, or Firm*—Ryan, Mason & Lewis, LLP

(57) ABSTRACT

A method for performing a wire-bonding operation in an integrated circuit utilizes a bonding tool. A wire is bonded to a first bond site in the integrated circuit, and terminated at a second bond site in the integrated circuit. The bonding and terminating steps are repeated for a plurality of additional wire bonds of the integrated circuit. At least two wire bonds in the integrated circuit are substantially perpendicular to one another at a crossing point in a plan view of the integrated circuit.

14 Claims, 5 Drawing Sheets

INTEGRATED CIRCUIT WITH SUBSTANTIALLY PERPENDICULAR WIRE BONDS

CROSS REFERENCE TO RELATED APPLICATION

The present invention is a divisional of U.S. application Ser. No. 10/926,631, filed Aug. 26, 2004, now U.S. Pat. No. 7,109,589 B2, issued Sep. 19, 2006, the disclosure of which is incorporated by reference herein.

FIELD OF THE INVENTION

The present invention relates generally to the field of integrated circuits and, more particularly, to wire-bonding operations performed on an integrated circuit.

BACKGROUND OF THE INVENTION

A radio frequency (RF) integrated circuit may include multiple transistor die that are placed in an integrated circuit package by a die attach machine. A robotic bonding tool may be used to wire bond the die to other circuit elements within the package, and to leads of a package leadframe. Such a tool generally includes a surface/wire-feed detection system that detects bond pads or other bond sites of a given die, and determines the height coordinates of these bond pads. The other circuit elements in an RF integrated circuit may include, for example, tuning capacitors.

The wire bonding of the various circuit elements may create several differently-shaped wire bond profiles, depending on the placement of the various circuit elements to be connected by wire bonds. A wire bond profile may be characterized as a side or profile view of a wire extending from a first bond site to a second bond site. In an RF integrated circuit, the wire bonds may carry high frequency signals. Certain types of RF integrated circuits, such as RF power transistors, are tuned through these wire bond profiles. Therefore, it is important for these wire bond profiles to achieve a desired shape for optimal RF performance.

The two major wire-bonding processes used for electronic package interconnects are wedge bonding and ball bonding. The wedge-bonding process has traditionally been used to form the package interconnects of RF integrated circuits due to its ease in forming the wire bond profiles necessary for optimal RF performance, while ball bonding provides a more economical and robust process than that of wedge bonding.

Standard wire bonds of RF integrated circuits are typically parallel to one another in a plan view of the integrated circuit. This parallel configuration results in a high level of mutual coupling capacitance between neighboring wire bonds. For example, on an output side of the integrated circuit, wire bonds are typically packed tightly together, resulting in a substantial mutual coupling capacitance. As the mutual coupling capacitance increases, the stability of the electrical performance and operating bandwidth decreases.

Previous attempts to solve the problem of mutual coupling capacitance included increasing the pitch of, or distance between, wire bonds. While increased distance between wire bonds assists in decreasing the mutual coupling capacitance between wire bonds, fewer wires are able to fit on the circuit elements, resulting in fewer wire bonds used in the integrated circuit. A smaller number of wire bonds in the integrated circuit is problematic for RF integrated circuits because it causes a higher series resistance and less tuning resolution for obtaining the resonance frequency.

Thus, a need remains for techniques for minimizing the effect of the mutual coupling capacitance between wire bonds in an integrated circuit.

SUMMARY OF THE INVENTION

The present invention in an illustrative embodiment provides an integrated circuit having wire bonds that permit improved RF performance and techniques for configuring such wire bonds in the integrated circuit.

In accordance with one aspect of the invention, an integrated circuit comprises an integrated circuit package and a plurality of circuit elements disposed within the integrated circuit package. A plurality of wire bonds provide connections for at least one of the circuit elements. At least one wire bond in a first subset of wire bonds and at least one wire bond in a second subset of wire bonds are substantially perpendicular to one another at a crossing point of the wire bonds in a plan view of the integrated circuit.

In accordance with another aspect of the invention, a method for performing a wire-bonding operation in an integrated circuit utilizes a bonding tool. A wire is bonded to a first bond site in the integrated circuit, and terminated at a second bond site in the integrated circuit. The bonding and terminating steps are repeated for a plurality of additional wire bonds of the integrated circuit. At least two wire bonds in the integrated circuit are substantially perpendicular to one another at a crossing point in a plan view of the integrated circuit.

Advantageously, an illustrative embodiment of the present invention produces wire bonds that allow for improved RF performance. The wire bond configuration of the illustrative embodiment of the present invention places neighboring wire bonds orthogonal to one another. Parallel conductors result in the most cross-coupling, while substantially orthogonal, or perpendicular, conductors result in the least cross-coupling. Thus, the illustrative embodiment minimizes effects of mutual coupling capacitance. Further, since the number of wire bonds does not decrease due to increased pitch, series resistance is not increased and tuning resolution for obtaining the resonance frequency does not decrease.

These and other objects, features, and advantages of the present invention will become apparent from the following detailed description of the illustrative embodiments thereof, which is to be read in connection with the accompanying drawings.

DETAILED DESCRIPTION

As will be described in detail below, the present invention in the illustrative embodiment provides an integrated circuit having wire bonds configured for improved RF performance, and techniques for forming such wire bonds in the integrated circuit.

Figure 1:
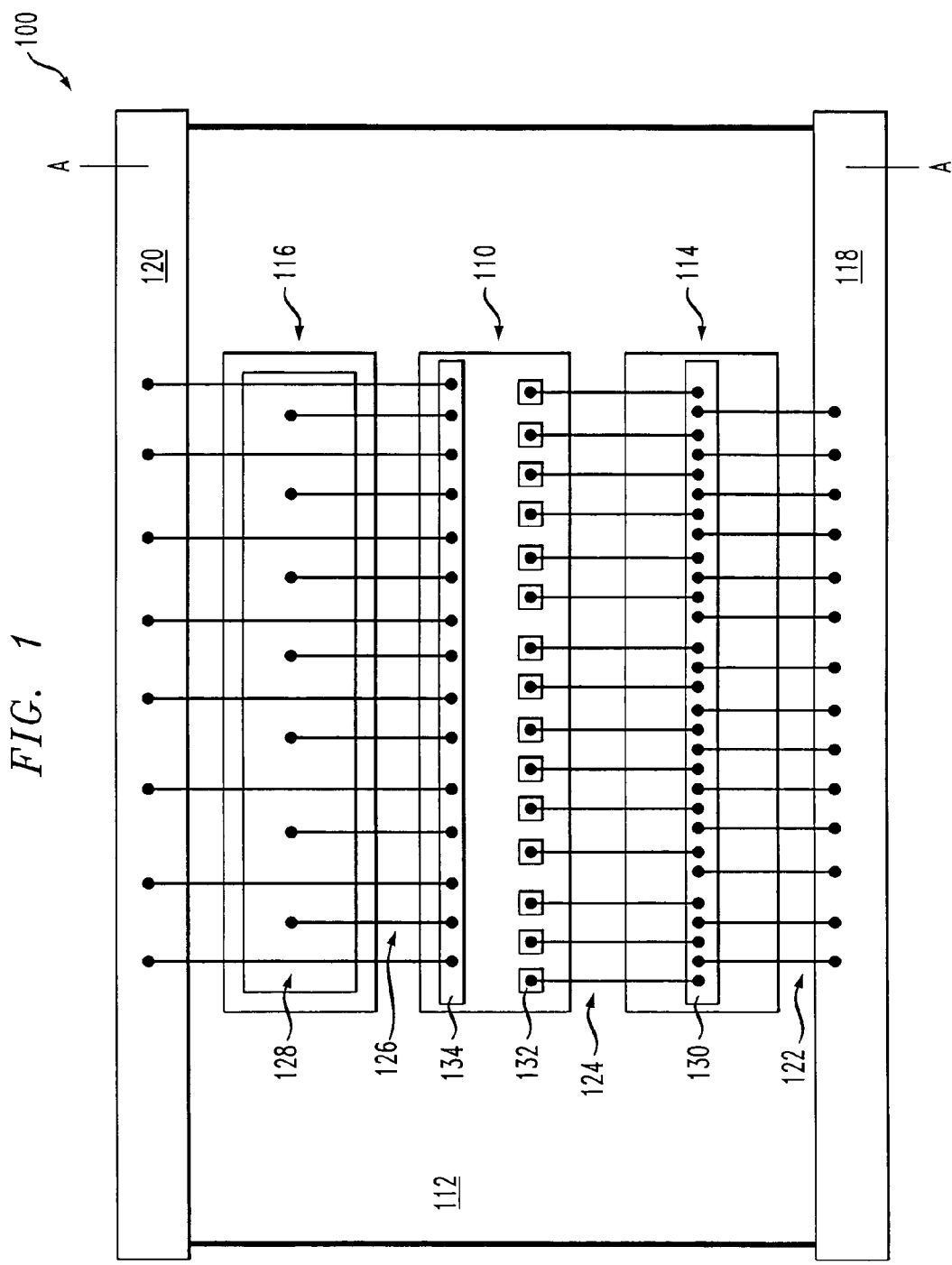
FIG. 1 is a diagram illustrating a plan view of an integrated circuit in which the present invention may be implemented.

Referring initially to FIG. 1, a die 110 is disposed in a packaged RF integrated circuit 100 on a substrate 112. Integrated circuit 100 is shown with an upper portion of the package removed so that the internal elements and wires are visible. FIG. 1 shows die 110 disposed between capacitors 114, 116. In this embodiment, die 110 is a transistor die and capacitors 114, 116 are tuning capacitors of packaged RF integrated circuit 100. Die 110 and tuning capacitors 114, 116 are disposed within an integrated circuit package. The package comprises a leadframe having leads illustrated by elements 118, 120.

As shown in the figure, a first wire bond set 122 connects lead 118 to first tuning capacitor 114. Similarly, a second wire bond set 124 connects first tuning capacitor 114 to die 110, a third wire bond set 126 connects die 110 to second tuning capacitor 116, and a fourth wire bond set 128 connects die 110 to lead 120. Third wire bond set 126 may be referred to as tuning wires, while fourth wire bond set 128 may be referred to as signal wires.

First wire bond set 122 and second wire bond set 124 are connected to a bond rail 130 on first tuning capacitor 114 in an alternating pattern. Individual wire bonds of second wire bond set 124 are connected to individual bond pads 132 on transistor die 110. Finally, third wire bond set 126 and fourth wire bond set 128 are connected to a bond rail 134 on transistor die 110. Individual wire bonds of third wire bond set 126 and fourth wire bond set 128 are disposed on bond rail 134 of transistor die 110 in an alternating pattern.

Figure 2:
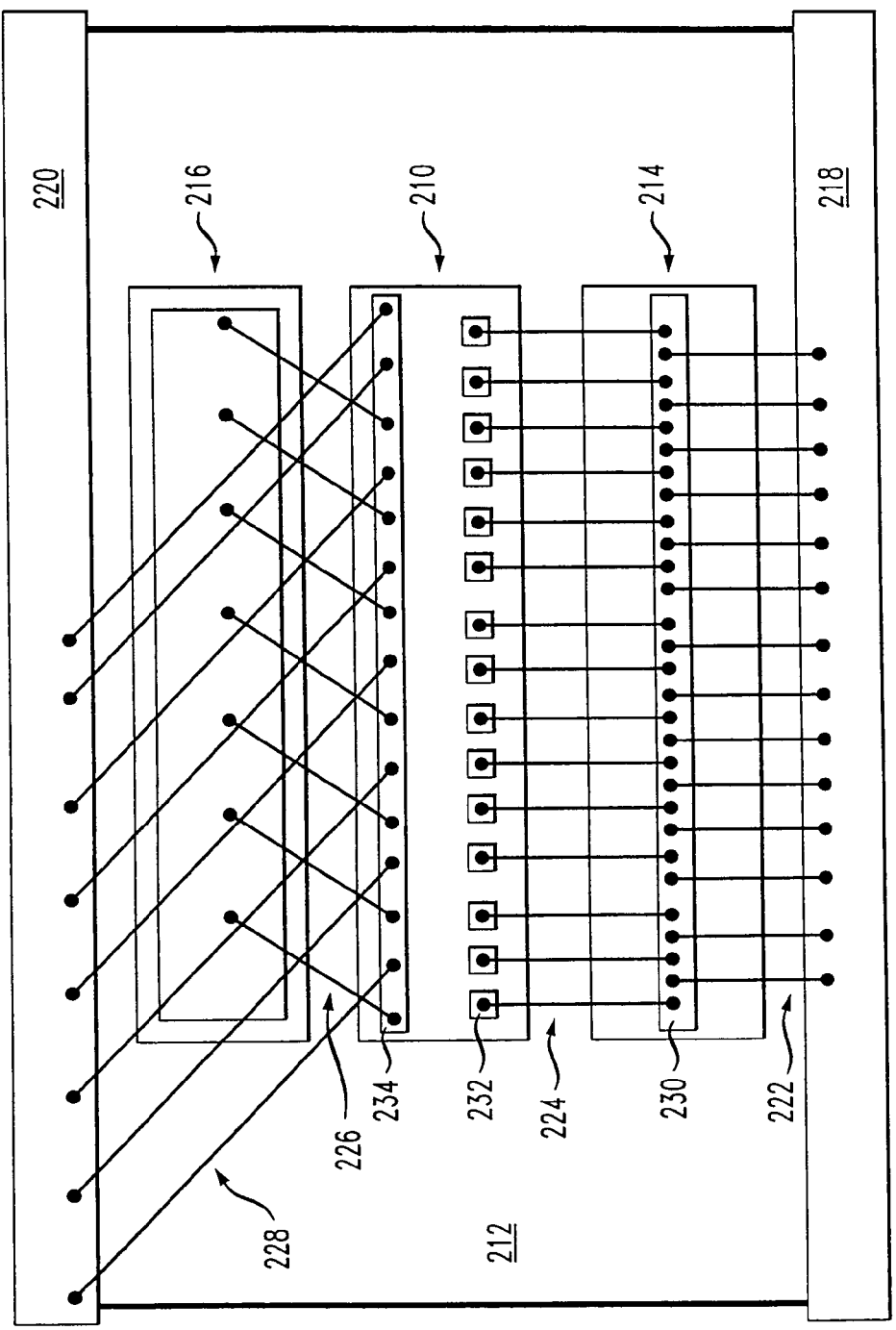
FIG. 2 is a diagram illustrating a plan view of an integrated circuit having substantially perpendicular wire bonds, according to an embodiment of the present invention.

A diagram illustrates an integrated circuit having substantially perpendicular wire bonds in FIG. 2, according to an embodiment of the present invention. A die 210 is disposed in a packaged RF integrated circuit 200 on a substrate 212. FIG. 2 shows transistor die 210 disposed between tuning capacitors 214, 216, within an integrated circuit package. The package comprises a leadframe having leads illustrated by elements 218, 220.

As in FIG. 1, a first wire bond set 222 connects lead 218 to a bond rail 230 of first tuning capacitor 214, a second wire bond set 224 extends from bond rail 230 of first tuning capacitor 214 to individual bond pads 232 of die 210, a third wire bond set 226 extends from a bond rail 234 of die 210 to second tuning capacitor 216, and a fourth wire bond set 228 extends from bond rail 234 of die 210 to lead 220.

As shown in FIG. 2, individual wire bonds of third wire bond set 226 and fourth wire bond set 228 are substantially perpendicular when they cross one another in this plan view. As described above, the substantially perpendicular nature of the crossing wire bonds decreases the mutual coupling capacitance of the neighboring wire bonds of third wire bond set 226 and fourth wire bond set 228. It is important to note that while the wire bonds cross when viewed in the plan view, they do not contact one another. Also, as shown in FIG. 2, an individual wire bond from third wire bond set 226 may cross up to three individual wire bonds of fourth wire bond set 228. An individual wire bond from fourth wire bond set 228 may cross up to three individual wire bonds of third wire bond set 226 in this embodiment. Different numbers of crossings may be used in other embodiments.

Figure 3:
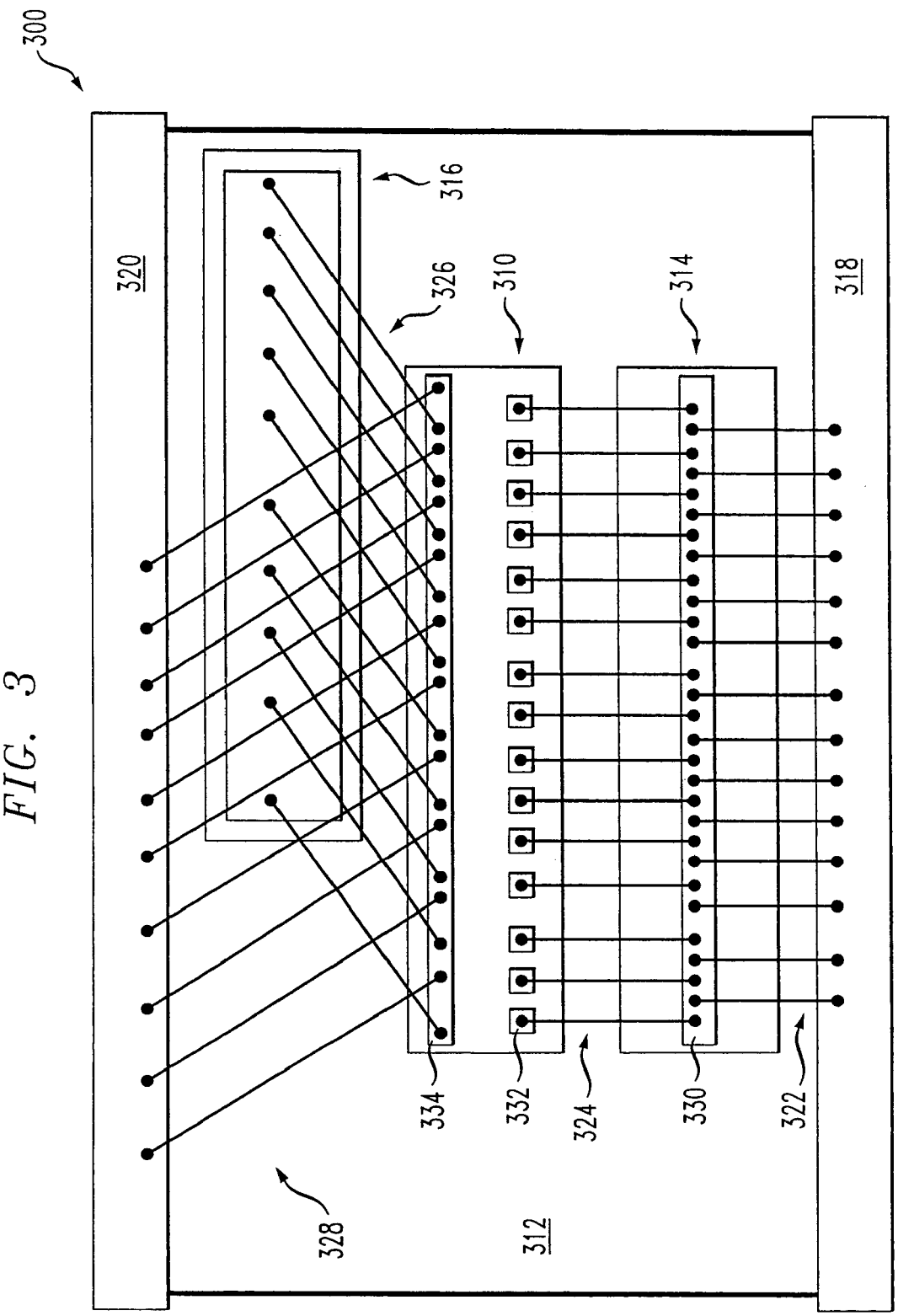
FIG. 3 is a diagram illustrating a plan view of an integrated circuit having substantially perpendicular wire bonds, with an offset circuit element, according to an embodiment of the present invention.

Another plan view of an integrated circuit having substantially perpendicular wire bonds, with an offset circuit element, according to an embodiment of the present invention is illustrated in FIG. 3. A die 310 is disposed in a packaged RF integrated circuit 300 on a substrate 312. FIG. 3 shows transistor die 310 disposed between tuning capacitors 314, 316 and disposed within a leadframe having leads illustrated by elements 318, 320.

Similar to FIG. 2 above, a first wire bond set 322 connects lead 318 to a bond rail 330 of first tuning capacitor 314, a second wire bond set 324 extends from bond rail 330 of first tuning capacitor 314 to individual bond pads 332 of die 310, a third wire bond set 326 extends from a bond rail 334 of die 310 to second tuning capacitor 316, and a fourth wire bond set 328 extends from bond rail 334 of die 310 to lead 320.

As in FIG. 2, individual wire bonds of third wire bond set 326 and fourth wire bond set 328 are substantially perpendicular to each other at crossing points in FIG. 3. FIG. 3 differs in that second tuning capacitor 316 is shifted parallel to a length along transistor die 310. Due to this shift of tuning capacitor 316, additional wire bonds of third wire bond set 326 and fourth wire bond set 328 are able to be configured between die 310, second tuning capacitor 316 and lead 320, while maintaining crossing points having substantially perpendicular wire bonds. As a result, an individual wire bond of third wire bond set 326 may cross up to five individual wire bonds of fourth wire bond set 328. Also, an individual wire bond of fourth wire bond set 328 may cross up to five individual wire bonds of third wire bond set 326 in this embodiment. The increased number of wire bonds in the integrated circuit decreases series resistance and increases tuning resolution for obtaining the resonance frequency.

Figure 4:
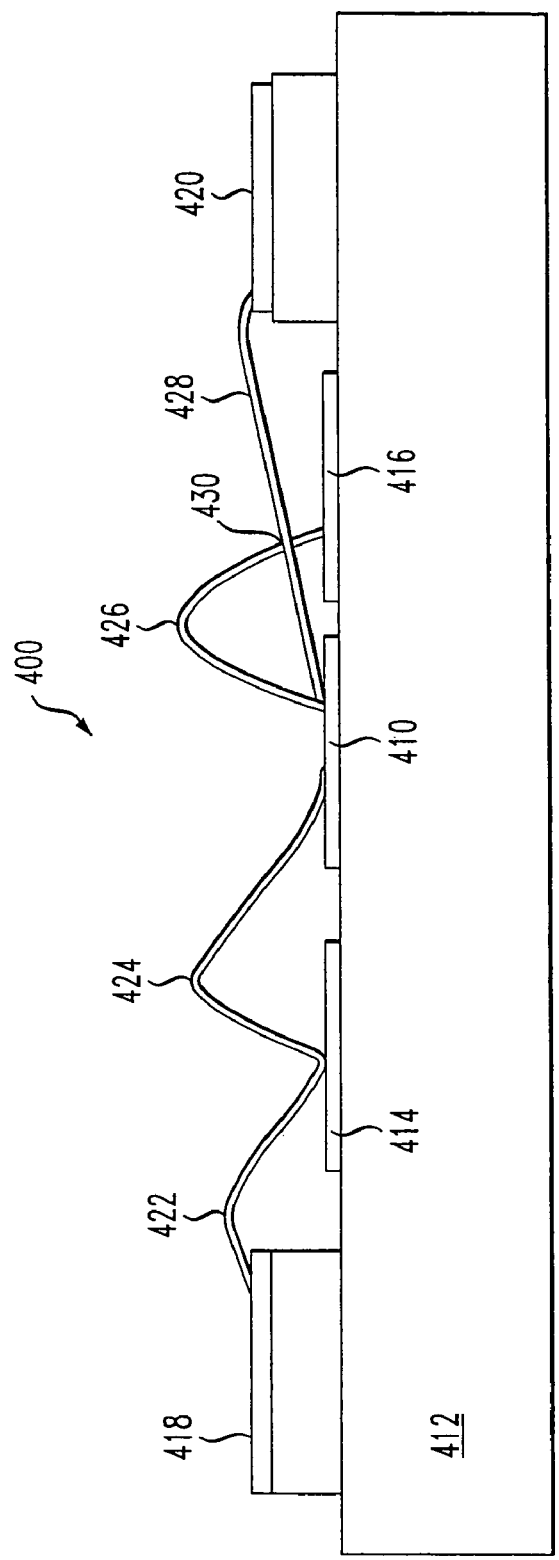
FIG. 4 is a diagram illustrating a side or profile view of the integrated circuit illustrated in FIG. 1.

Referring now to FIG. 4, a diagram illustrates a profile view of the integrated circuit illustrated in FIG. 1. More specifically the profile view is from cross-section A-A shown in FIG. 1. FIGS. 2 and 3 have substantially similar profile views. Packaged RF integrated circuit 400 has a die 410 disposed between two capacitors 414, 416. Leads 418, 420 are adjacent respective capacitors 414, 416. A first wire bond 422 extends from a bond site on lead 418 to a bond site on first capacitor 414. A second wire bond 424 connects a bond site on first capacitor 414 to a bond site on die 410. A third wire bond 426 connects a bond site on die 410 to a bond site on second capacitor 416. Finally, a fourth wire bond 428 connects a bond site on die 410 to a bond site on lead 420. It is generally advantageous that wires connecting similar elements have substantially identical wire bond profiles, although this is not a requirement of the invention.

As shown in FIG. 4, the profiles of third wire bond 426 and fourth wire bond 428 are substantially perpendicular at a crossing point 430. As illustrated in FIGS. 1-3, third and fourth wire bonds are bonded to the die in an alternating manner. Therefore, since neighboring wire bonds are substantially perpendicular at a crossing point in the profile view, the mutual coupling capacitance between the two wire bonds is decreased.

Figure 5:
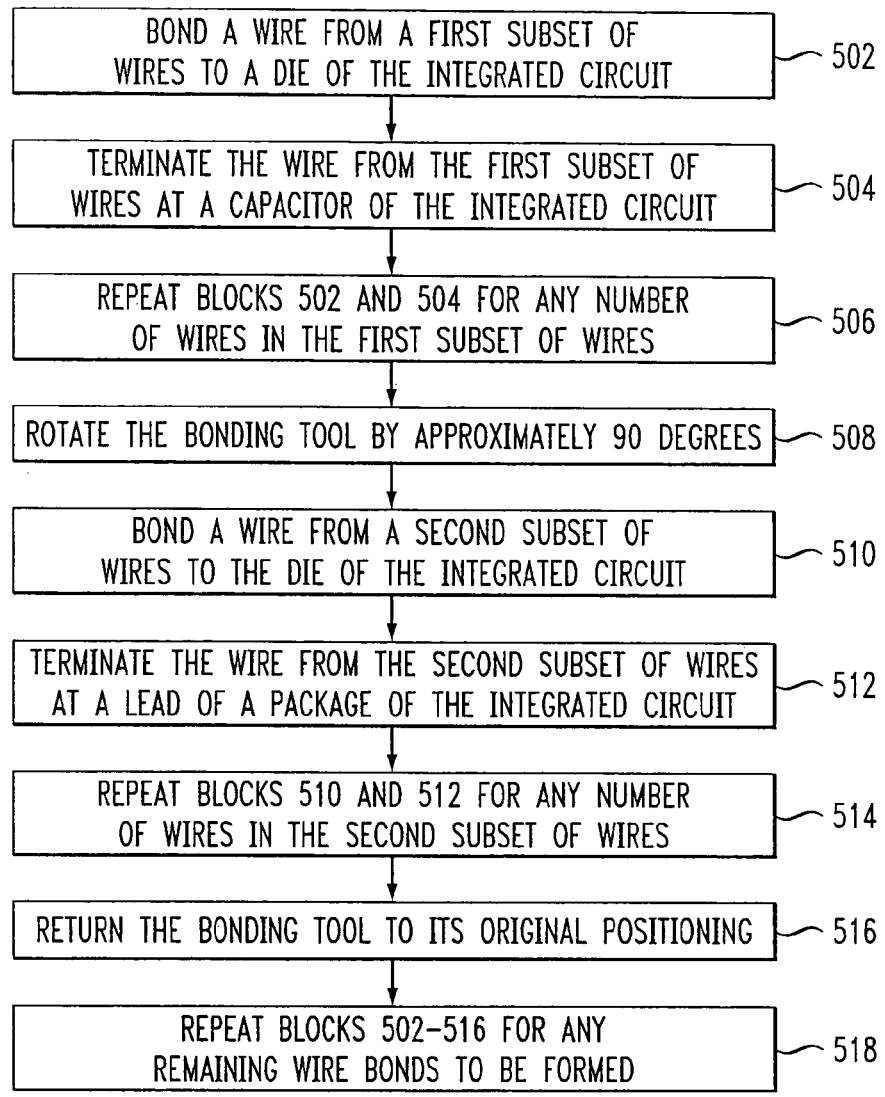
FIG. 5 is a flow diagram illustrating a bonding methodology for an RF integrated circuit, according to an embodiment of the present invention.

Referring now to FIG. 5, a flow diagram illustrates a wire-bonding methodology for an RF integrated circuit. This example methodology may be used to form the substantially perpendicular wire bonds shown in FIGS. 2 and 3. In block 502, a wire from a first subset of wires is bonded to a die of the integrated circuit. The wire from the first subset of wires is terminated at a capacitor of the integrated circuit in block 504. In block 506, blocks 502 and 504 may be repeated for any number of wires in the first subset of wires, depending on the preferred bonding order of the programmer. In bonding these wires, the bonding tool is originally positioned so that the resulting wire bond is approximately 45 degrees from a line perpendicular to the length of the die in the direction of the capacitor.

In block 508, the bonding tool is rotated by approximately 90 degrees. This rotation begins in a direction toward the perpendicular line described above and results in a positioning that is also approximately 45 degrees from the line perpendicular to the length of the die in a direction of the capacitor, but opposite that of the original positioning. A wire from a second subset of wires is bonded to the die of the integrated circuit in block 510. The wire from the second subset of wires is terminated at a lead of a package of the integrated circuit in block 512. In block 514, blocks 510 and 512 may be repeated for any number of wires in the second subset of wires, depending on the preferred bonding order of the programmer. In block 516, the bonding tool may be returned to its original positioning.

In block 518, blocks 502-516 may be repeated for any remaining wire bonds to be formed. At least two wire bonds are formed in the integrated circuit that are substantially perpendicular to one another at their crossing point in a plan view of the integrated circuit. In rotating the bonding tool by approximately 90 degrees between the bonding operations of the first and second subsets of wires, the wires will be substantially perpendicular at their crossing points. The bonding tool avoids contacting existing wire bonds in the bonding operation and configures the wire bonds so that they are not in contact with one another. The bonding operation described in the methodology of FIG. 5 preferably joins first and second subsets of wires from the transistor die to the second tuning capacitor and the second lead, respectively. The individual wire bonds of the first and second subsets of wires are positioned on the transistor die in an alternating manner.

Figure 6:
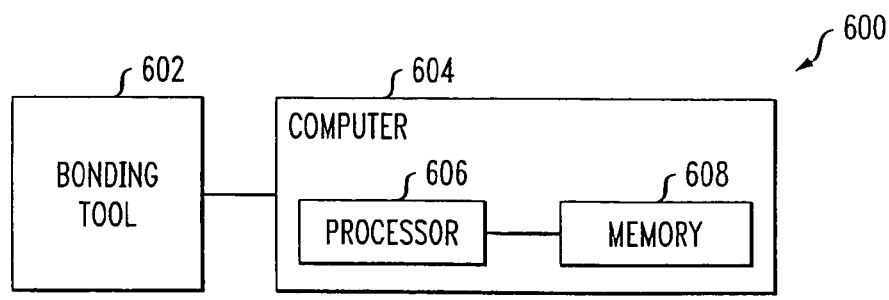
FIG. 6 is a block diagram illustrating an example bonding system suitable for implementing a wire-bonding technique, according to an embodiment of the present invention.

FIG. 6 is a block diagram that illustrates an example of bonding system 600 in which a wire-bonding technique of the invention may be implemented. As illustrated, the system 600 comprises a bonding tool 602 coupled to a computer 604, which may comprise a processor 606 and a memory 608. One or more of the steps shown in FIG. 5 may be performed at least in part utilizing software executed by processor 606 and stored in memory 608.

Accordingly, as described herein, the present invention in the illustrative embodiment provides an integrated circuit having wire bonds configured for improved RF performance, and techniques for forming such wire bonds in the integrated circuit.

Additional embodiments of the present invention may incorporate various numbers and combinations of transistor die, tuning capacitors, leads, or other circuit elements, arranged in various configurations within a given integrated circuit. The positioning and number of transistor die, tuning capacitors and other elements will of course result in various numbers and configurations of wire bonds and associated bond sites. The techniques of the present invention may also be used in non-RF integrated circuits. Further, additional embodiments may incorporate various wire bond shapes, wire bond heights, wire diameters and other wire characteristics.

Regarding the various numbers and combinations of transistor die, a plurality of identical die are typically formed in a repeated pattern on a surface of the wafer. Each die includes a device as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Therefore, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for performing a wire-bonding operation in an integrated circuit, utilizing a bonding tool, the method comprising the steps of:

bonding a wire to a first bond site in the integrated circuit; and terminating the wire at a second bond site;

wherein the bonding and terminating steps are repeated for a plurality of additional wires to form a first subset of bonded wires connecting a first circuit element of a plurality of circuit elements to a second circuit element of the plurality of circuit elements, and a second subset of bonded wires connecting the first circuit element to a lead of the integrated circuit package, wherein the second element is disposed at least partially between the first element and the lead of the integrated circuit package, and at least one bonded wire in the first subset of bonded wires and at least one bonded wire in the second subset of bonded wires are substantially perpendicular to one another at a crossing point of the bonded wires in a plan view of the integrated circuit.

2. The method of claim 1, wherein a profile of at least one bonded wire in the first subset of bonded wires and a profile of at least one bonded wire in the second subset of bonded wires are substantially perpendicular to one another at a crossing point thereof.

3. The method of claim 1, wherein the step of bonding a wire to a first bond site comprises bonding a wire to a die of the integrated circuit.

4. The method of claim 3, wherein the step of terminating a wire at a second bond site for the first subset of bonded wires further comprises the step of terminating a wire at a capacitor of the integrated circuit.

5. The method of claim 4, wherein bonded wires in the first subset of bonded wires comprise tuning wires.

6. The method of claim 4, wherein the step of terminating a wire at a second bond site for the second subset of bonded wires further comprises the step of terminating a wire at a lead of a package of the integrated circuit.

7. The method of claim 6, wherein the bonded wires in the second subset of bonded wires comprise signal wires.

8. The method of claim 6, wherein the step of bonding a wire to a die of the integrated circuit comprises the step of bonding at least one wire of the first subset of bonded wires and at least one wire of the second subset of bonded wires in an alternating pattern on the die.

9. The method of claim 6, further comprising the step of rotating the bonding tool by approximately 90 degrees after a series of bonding and terminating steps so that each wire in the first subset of bonded wires is substantially perpendicular to each wire in the second subset of bonded wires in a plan view of the integrated circuit.

10. The method of claim 6, wherein the capacitor is offset from the die in a direction parallel with a length of the die.

11. The method of claim 1, wherein mutual coupling of the first subset of bonded wires and the second subset of bonded wires is reduced to approximately zero.

12. The method of claim 1, wherein at least one bonded wire in the first subset of bonded wires crosses a plurality of bonded wires in the second subset of bonded wires.

13. Apparatus for performing a wire-bonding operation in an integrated circuit, the apparatus comprising:

a bonding tool;

a memory; and at least one processor, coupled to the memory, and operative to control the bonding tool to perform the steps of: (i) bonding a wire to a first bond site in the integrated circuit; and (ii) terminating the wire at a second bond site; wherein the bonding and terminating steps are repeated for a plurality of additional wires to form a first subset of bonded wires connecting a first circuit element of a plurality of circuit elements to a second circuit element of the plurality of circuit elements, and a second subset of bonded wires connecting the first circuit element to a lead of the integrated circuit package, wherein the second element is disposed at least partially between the first element and the lead of the integrated circuit package, and at least one bonded wire in the first subset of bonded wires and at least one bonded wire in the second subset of bonded wires are substantially perpendicular to one another at a crossing point of the bonded wires in a plan view of the integrated circuit.

14. An article of manufacture for performing a wire-bonding operation in an integrated circuit, utilizing a bonding tool, comprising a machine readable medium containing one or more programs which when executed implement the steps of:

bonding a wire to a first bond site in the integrated circuit; and terminating the wire at a second bond site;

wherein the bonding and terminating steps are repeated for a plurality of additional wires to form a first subset of bonded wires connecting a first circuit element of a plurality of circuit elements to a second circuit element of the plurality of circuit elements, and a second subset of bonded wires connecting the first circuit element to a lead of the integrated circuit package, wherein the second element is disposed at least partially between the first element and the lead of the integrated circuit package, and at least one bonded wire in the first subset of bonded wires and at least one bonded wire in the second subset of bonded wires are substantially perpendicular to one another at a crossing point of the bonded wires in a plan view of the integrated circuit.

* * * * *